United States Patent
Peng et al.

(10) Patent No.: US 7,115,856 B2
(45) Date of Patent: Oct. 3, 2006

(54) DIGITAL, TOUCHLESS ELECTRICAL SWITCH

(75) Inventors: Robin Peng, South Jordan, UT (US); Kent Mabey, West Jordan, UT (US)

(73) Assignee: Design Engine, West Sandy, UT (US)

( * ) Notice: Subject to any disclaimer, the term of this patent is extended or adjusted under 35 U.S.C. 154(b) by 147 days.

(21) Appl. No.: 10/731,878

(22) Filed: Dec. 8, 2003

(65) Prior Publication Data
US 2005/0121602 A1    Jun. 9, 2005

(51) Int. Cl.
*G06M 7/00* (2006.01)
*H01J 40/14* (2006.01)

(52) U.S. Cl. .................. 250/221; 340/555; 340/567

(58) Field of Classification Search ............. 250/221, 250/222.1, 214 R, 214 D, 214 SW; 340/541, 340/555–557, 567; 315/159
See application file for complete search history.

(56) References Cited

U.S. PATENT DOCUMENTS

| | | | | |
|---|---|---|---|---|
| 4,305,006 A | * | 12/1981 | Walthall et al. ............... 307/38 |
| 5,594,238 A | * | 1/1997 | Endruschat et al. ........ 250/221 |
| 5,973,608 A | * | 10/1999 | McMahon .................... 341/33 |
| 5,977,878 A | * | 11/1999 | Lang ........................ 340/815.4 |

\* cited by examiner

*Primary Examiner*—Thanh X. Luu
*Assistant Examiner*—Suezu Ellis
(74) *Attorney, Agent, or Firm*—Trent H. Baker; Baker & Associates PLLC (57) ABSTRACT

A touchless, digital electrical switch includes at least one sensor that is oriented or associated with other elements in such a way as to detect substantially vertical sweeping, or switching, motions. When an intended switching motion is sensed by the optical sensors within a predetermined period of time, loads are switched and the status of a switch is communicated to other switches, if any, along the same circuit (i.e., the "position" of the switch is changed). An indication of the "position" of the switch may be provided by way of a visual indicator. An acceptable switching motion may also result in an audible "click" or other signal.

25 Claims, 5 Drawing Sheets

DIGITAL, TOUCHLESS ELECTRICAL SWITCH

BACKGROUND OF THE INVENTION

1. Field of the Invention

The present invention relates generally to touchless electrical switches and, more specifically, to touchless electrical switches that operate by mimicking the operation of conventional, two-way switches.

2. Background of Related Art

Electrical switches have long been used to enable an individual to open or close electrical circuits and, thus, to turn electrically operated apparatus on and off (e.g., wall-mounted light switches are useful for turning lights on and off, as well as for controlling whether or not power is provided to wall-mounted electrical sockets). Electrical switches (e.g., dimmer switches) may also be configured to control the amount of power that is provided to an electrically operated apparatus.

Two-way electrical switches typically have two positions, an "on" position, in which power is provided to an electrically operated apparatus in communication with and under control of the switch, and an "off" position, in which power is not provided to the electrically operated apparatus. Conventional, wall-mounted light switches are an example of such two-way electrical switches. A typical conventional, wall-mounted light switch may be oriented in a somewhat upwardly facing direction or in a somewhat downwardly facing direction, with one such direction comprising the "on" position and the other direction comprising the "off" position. Orientation of the switch is effected manually, typically with the fingers of a user of the electrically operated apparatus.

Although conventional wall-mounted electrical switches are practically ubiquitous, they do not provide a "state-of-the-art" feel in modern environments. The use of moving parts in manually operated electrical switches is also somewhat undesirable, as moving parts tend to wear over time and may require maintenance or replacement of the entire switch. Moreover, since such electrical switches are operated by users' hands, they may collect oils and dirt and, thus, require occasional cleaning. Additionally, the exterior surfaces of conventional electrical switches may become contaminated with undesirable substances, such as viruses and bacteria, which may be transferred to others who subsequently use or touch the contaminated surfaces of such conventional electrical switches.

Further, due to the mechanical nature of conventional electrical switches, an electrical arc, or spark, is typically generated as conventional electrical switches are used. While the generation of a spark is usually not problematic in most environments, sparks have been known to result in fires. Moreover, the use of conventional electrical switches is limited in volatile environments, where the result of a spark could be explosive.

Hands-free electrical switches, which lack many of these undesirable features, are also known. Such switches are typically controlled by motion sensors, which may sense any type of motion close to the switch or any type of motion a relatively far distance therefrom. Typically, motion-sensing electrical switches include a single motion sensor. The motion sensor may be configured to cause the switch to both provide power to (turn "on") or terminate the supply of power to (turn "off") an electrical apparatus in communication therewith. Alternatively, a motion-sensing electrical switch may just cause the switch to supply power to an electrical apparatus in communication therewith. Some hands-free, motion sensing electrical switches also include manual "on/off" buttons, which may be depressed to turn an electrical apparatus on or off when the motion sensor does not provide the desired electrical switching function.

While motion-sensing, hands-free electrical switches lack many of the undesirable features of conventional, manually-operated electrical switches, they also lack many of the endearing features of conventional, manually-operated electrical switches. In particular, hands-free electrical switches do not provide a user thereof with a readily perceivable indication of the orientation of the switch. Moreover, while hands-free electrical switches sense a user's motion to turn on or off, they typically employ only a single sensor and, therefore, cannot distinguish between arbitrary motion and the type of motion that is intended to turn the electrical switch on or off.

The inventors are unaware of any hands-free switches that operate in a manner that is capable of distinguishing between motion which is intended to turn them on or off and arbitrary motion, and of hands-free light switches which require that the operation of conventional, wall-mounted electrical switches be mimicked.

SUMMARY OF THE INVENTION

The present invention includes a solid-state hands-free electrical switch, which is also referred to herein as a "digital switch." A hands-free electrical switch according to the present invention includes a motion-detection element with one or more detectors, or sensors, that are configured to detect, or sense, substantially linear (e.g., upward and downward) movement of a finger or hand of a user or another object, as well as one or more position indicators that visually display an orientation of the electrical switch. Additionally, the detection element of a hands-free electrical switch of the present invention may include a pair of emitters, which emit electromagnetic radiation that may be reflected, then detected, by the one or more detectors.

The hands-free electrical switch of the present invention may be embodied as a wall-mounted apparatus. By way of example only, the hands-free electrical switch may include a pair of emitters and one or more detectors. The emitters emit electromagnetic radiation of one or more wavelengths. Each detector is configured to detect at least one wavelength of electromagnetic radiation emitted by the emitters. Upon reflection of at least one wavelength of electromagnetic radiation emitted by the emitters toward a detector, the detector detects that electromagnetic radiation.

In a more specific example of a hands-free electrical switch according to the present invention, a single detector may be positioned between two emitters. The electromagnetic radiation that is emitted from the first emitter may, for example, be distinguished from the electromagnetic radiation emitted by the second emitter by pulsing the emitters in sets, each set of pulsing of one of the emitters being out-of-phase with, or alternating with, each set of pulsing of the other emitter. The frequency and timing of such pulsing may be controlled by a processor that communicates with the emitters. The emitters may be configured to emit electromagnetic radiation in a somewhat conical or frustoconical fashion, such that the "cones" of electromagnetic radiation that are emitted by the two emitters intersect. The detector of such a hands-free electrical switch also communicates with the processor. Because the processor controls pulsing of the two emitters, it can identify which of the emitters is the source of detected electromagnetic radiation The processor communicates with a driver, which is also referred to herein as an "electronic switching element," which operates in such a way as to physically open or close an electrical circuit along which the hands-free electrical switch is positioned.

Such a hands-free electrical switch may be used by sweeping a finger or hand of a user or an object substantially linearly (e.g., upwardly or downwardly) over the hands-free electrical switch, in close proximity thereto, much like the action required to change the position of a conventional wall-mounted electrical switch (e.g., a conventional light switch). As the hand or object passes one, pulsed electromagnetic radiation emitted therefrom is reflected toward the at least one detector. Due to the sweeping, or switching, motion of the hand or object, the detector next detects electromagnetic radiation from both of the emitters. Finally, when the hand or object passes over the other emitter, only electromagnetic radiation from that emitter is detected. Only when such a pattern of reflected electromagnetic radiation is detected does the processor cause the "position" of the switch to change. The processor may also be programmed to require that a certain number of groups of pulses of radiation from one or both emitters be detected before causing the electronic switching element to effect a change in the "position" of the switch. The processor, which also communicates with the position indicators, causes the position indicator or indicators to correctly reveal the new "position" of the hands-free electrical switch.

Another example of hands-free electrical switch according to the present invention includes first and second motion sensors, as well as corresponding timers and switch gates. As a first sensor senses motion in proximity thereto, that sensor "trips" and starts a timer associated therewith. If the motion sensed by the first sensor is an intended switching motion, such as intuitive, normal, conformed up or down operation of a conventional wall mounted electrical switch, a second sensor will subsequently sense the switching motion within a predetermined period of time. As the second sensor is "tripped", a timer associated with the second sensor is activated and a switch gate (e.g., an "on" or "off" gate) associated with the second sensor is enabled. A driver, or "electronic switching element", keeps the most recently enabled gate enabled until an opposite intended switching motion is detected by both the first and second sensors. If, on the other hand, motion is only sensed by one of the sensors within a predetermined period of time, no such switching action will occur. Such switching motion may be accompanied by activation of a corresponding visual indicator, such as a light emitting diode (LED), associated with the newly enabled gate. For example, if a lower visual indicator is lit and it is desired to change the switch to an opposite state, an upward switching motion may be effected in proximity to the digital switch. When such an upward switching motion occurs, the lower and upper sensors of the digital switch sense the switching motion in sequence and the electronic switch disables the lower switch gate and enables the upper switch gate. As the upper switch gate is enabled, the corresponding, upper visual indicator is also activated (e.g., in the case of an LED, lit).

Optionally, instead of sensing motion, such a hands-free electrical switch may include a pair of detectors that are configured to detect electromagnetic radiation of one or more wavelengths. Additionally, the hands-free electrical switch may include a pair of emitters, one associated with each detector, that is configured to emit electromagnetic radiation of a wavelength that may be detected by the corresponding detector. As an object, such as a hand, passes over each emitter, electromagnetic radiation emitted therefrom is reflected back to the corresponding detector. The presence or absence of a switching motion is detected and operation of the switch occurs as described above with respect to the motion-sensing embodiment of the hands-free electrical switch.

A hands-free electrical switch according to the present invention may also include a processor and/or other components which effect automated and/or programmable features (e.g., a timer, remote-controlled operability, etc.), dimming features, audio features (e.g., the sound of the "click" of a light switch) and the like.

Other features and advantages of the present invention will become apparent to those of ordinary skill in the art through consideration of the ensuing description, the accompanying drawings, and the appended claims.

BRIEF DESCRIPTION OF THE DRAWINGS

In the drawings, which depict various aspects of exemplary embodiments of the present invention.

DETAILED DESCRIPTION

Figure 1:
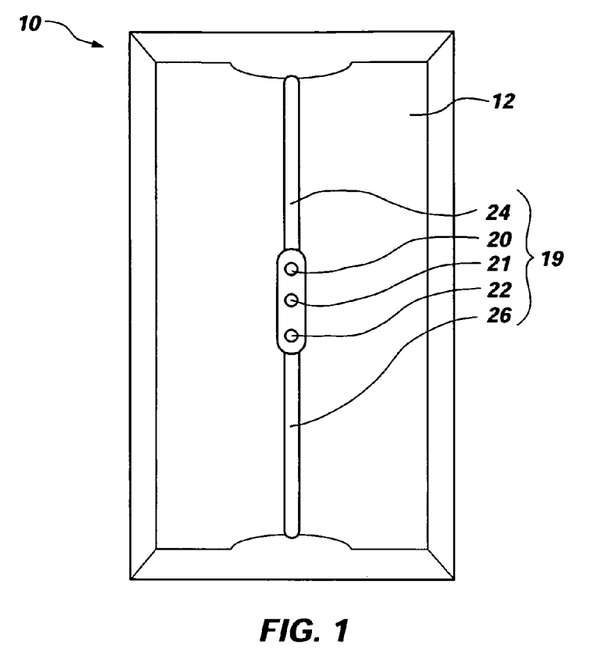
FIG. 1 is a frontal plan view of an exemplary embodiment of digital switch according to the present invention.

The exterior features of an exemplary digital switch 10 incorporating teachings of the present invention are illustrated in FIG. 1. Digital switch 10 includes a faceplate 12 which is configured to be coupled with an interior 30 (FIG. 2) and housing 50 (FIG. 2) of digital switch 10, which are at least partially received within a wall (not shown), and to be electrically connected to wires 60, 62 (FIG. 2) within the wall and an electrical circuit of which the wiring is a part. Although digital switch 10 is depicted as being connected to only two wires 60, 62, connection of digital switch to more than two wires (e.g., in a three-way switching configuration, for communication purposes, etc.) is also within the scope of the present invention.

Faceplate 12 is configured to be secured to the wall in such a way as to cover a receptacle, such as a hole, in the wall within which the remainder of digital switch 10 is received. As it may be desirable to design faceplate 12 to have a particular, possibly unique appearance, faceplate 12 may comprise a modular unit which is configured to be easily removed from and replaced on the remainder of digital switch 10.

Figure 2:
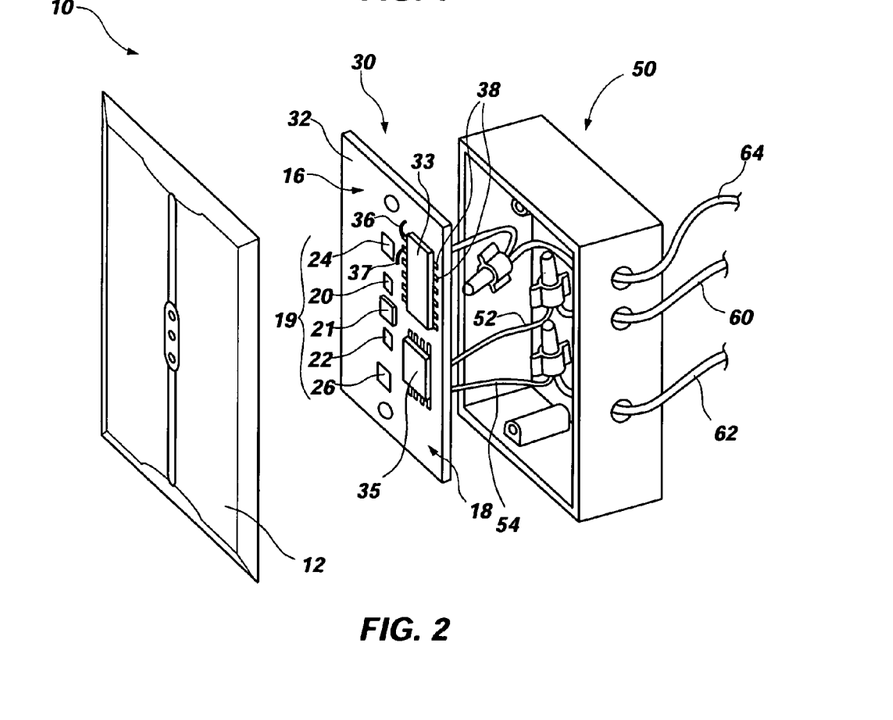
FIG. 2 is a perspective assembly view of the digital switch of FIG. 2.

As shown in FIGS. 1 and 2, interior 30 of digital switch 10 includes an upper region 16 and a lower region 18, which roughly correspond to the upper and lower regions of a conventional, manually operated wall-mountable electrical switch. The exterior features of a motion detection element 19, which includes emitters 20, 22, a detector 21, and visual indicators 24, 26, are exposed through faceplate 12, with emitter 20 and indicator 24 being located in upper region 16, emitter 22 and indicator 26 being located in lower region 18, and detector 21 being located between upper region 16 and lower region 18.

In addition, substrate 32 carries a processor 33, with which each emitter 20, 22, detector 21, and visual indicator 24, 26 communicates.

Processor 33 communicates with and controls operation of both a communication link 34 (FIG. 3) and a driver 35 of known types. Driver 35 communicates with terminals (not shown) that are configured to have wires 60, 62 electrically connected thereto. Communication link 34 may also communicate with at least one wire 64, which facilitates communication between digital switch 10 and other components (e.g., another digital switch 10 positioned along the same circuit, a device with which digital switch 10 is networked, such as a computer, a personal data assistant (PDA), or the like, etc.). The terminals and wires 60, 62 are at least partially contained within a housing 50 of digital switch 10.

Figure 3:
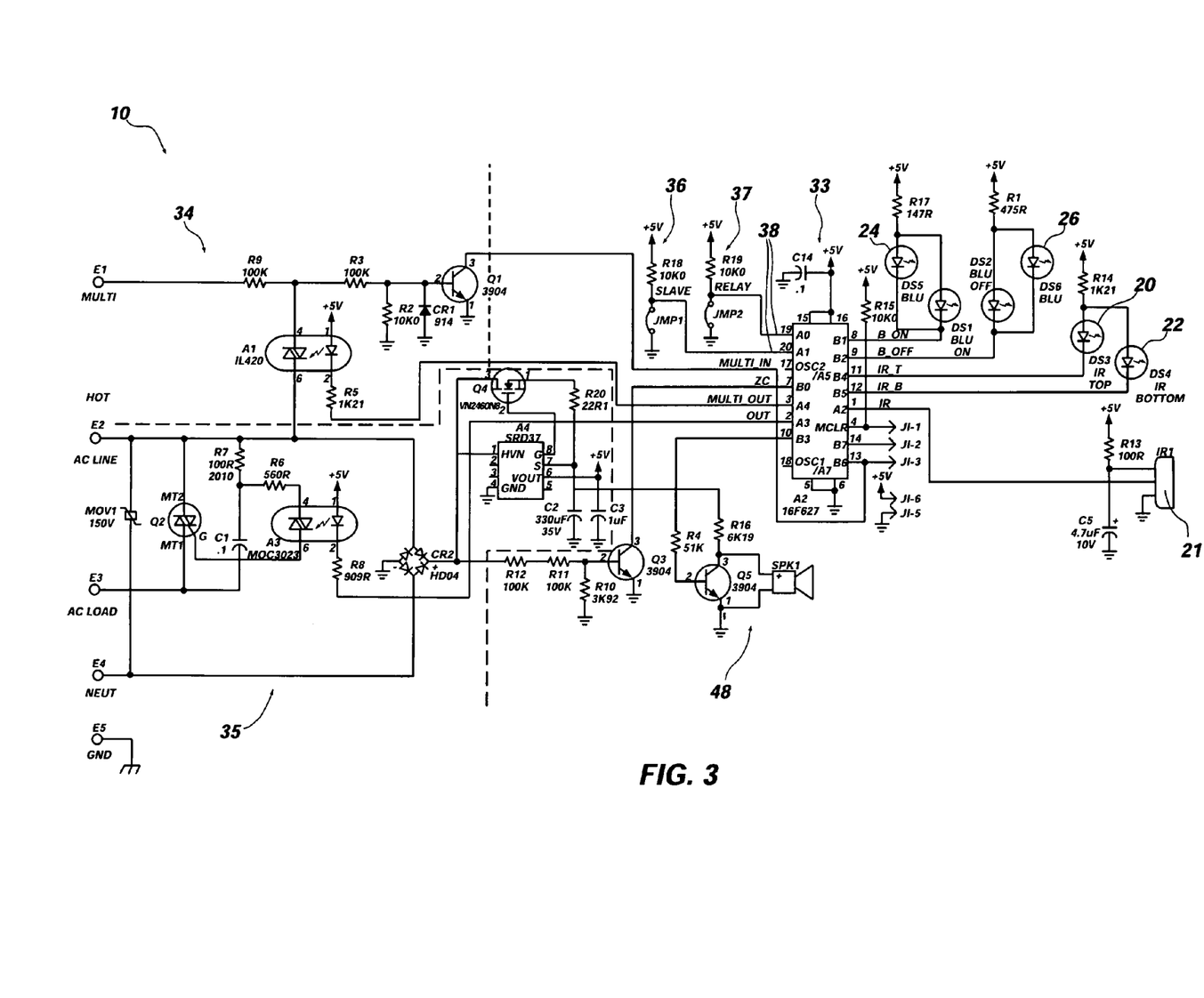
FIG. 3 is a schematic showing exemplary components of the digital switch of FIGS. 2 and 3.

Turning now to FIG. 3, the illustrated electrical diagram schematically depicts the various electrical/electronic features of digital switch 10, many or all of which may be carried upon substrate 32 (FIG. 2).

Processor 33 may comprise any suitable microcontroller or computer processor. By way of nonlimiting example, a flash-based microcontroller, such as an 8-bit flash-based PICMICRO® microcontroller with electrically-erasable programmable read-only memory (EEPROM) available from Microchip Technology Inc. of Chandler, Ariz., may be employed as processor 33. The memory elements of processor 33, or separate memory associated therewith, "saves" the desired status (e.g., "on," "off," intensity of power, etc.) of the circuit along which digital switch 10 is positioned.

So-called "jumpers" 36, 37 may be positioned in communication with pins 38 of processor 33 or between appropriate pairs of pins 38 of processor 33, establishing communication therebetween, to impart digital switch 10 with optional functionality. For example, jumper 36 may be included to impart digital switch 10 with the ability to control the power conveyed therethrough, which, when digital switch 10 communicates with a light, provides dimming capability. Jumper 37 may determine whether digital switch 10 operates as a "master" switch, which actually controls the flow of electrical current through a circuit along which digital switch 10 is positioned, or as a "slave" switch, which communicates a desired action (e.g.,. switching on or off, dimming, etc.) to a master switch on the same circuit.

Communication link 34 may, by way of example only, comprise an optically coupled triac, such as that manufactured by Infinion Technologies AG of Munich, Germany, as part no. IL420. Communication link 34, which may communicate with external components by way of one or more wires 64 of the circuit along which digital switch 10 is positioned, provides an interface between the logic elements (which operate under direct current (DC)) of digital switch 10, such as processor 33, and other units, including other digital switches 10 and devices (e.g., computers, PDAs, etc.).

Communication between multiple digital switches 10, as in 3-way, 4-way, or other multiple switching applications, facilitates updating of the "position" of a master digital switch 10 in accordance with signals that are transmitted by slave digital switches 10 in communication therewith and communication from the master to the slaves. Thus, if a user indicates, at a slave digital switch 10, that the circuit along which the slave digital switch is positioned is to be turned "on," turned "off," or that dimmed power is to be increased or decreased, signals representative of the desired action are transmitted by communication link 34 of the slave digital switch, along the circuit or another element (e.g., a wire, wireless means, etc.), to the master digital switch, which then effects the desired action.

A driver and receiver of communication link 34 may be configured to relay information about the switch status and signals to make dimming changes (e.g., a 120 V alternating current (AC)), such as the phase of the current (e.g., the location of the AC along a sine wave at a particular point in time) to processor 33. For example, if processor 33 causes the LED of the driver to be illuminated for an entire half cycle (about 8 ms), the driver of communication link 34 may communicate to all digital switches 10 on the communication line (e.g., wire 64) to turn "on." If LED is illuminated for three-fourths of a half cycle (i.e., about 6 ms), the communication is for digital switch 10 to turn "off." The gate of driver 35 may communicate to ramp up the power or intensity of the electrical signal conveyed therethrough when illuminated by the LED for one-half of a half cycle (i.e., about 4 ms). The gate of driver 35 may communicate to ramp down the power or intensity of the electrical signal conveyed therethrough when illuminated by the LED for one-fourth of a half cycle (i.e., about 2 ms).

Driver 35, which may also comprise an optically coupled triac, such as that designated as part no. MOC3023 by a variety of suppliers, including Motorola, Inc., of Schaumburg, Ill., establishes communication between the logic elements (which operate under direct current (DC)) of digital switch 10, such as processor 33, a triac such as a BTB24-600BW made by STMicroelectronics, and wires 60, 62 (FIG. 2), which are a part of an alternating current network.

As known in the art, a zero cross monitor Q3 and associated parts, monitor a complete 120V AC cycle (an entire sine wave, including a peak and valley), which lasts for about 17 milliseconds (ms). Thus, the sine wave "crosses zero" about once every 8 ms. Processor 33 may be programmed to monitor the phase of the AC so as to operate synchronously therewith.

Driver 35, may, as is well known in the art, include an LED which operates under control of processor 33 and, in turn, optically activates a gate of driver 35 to cause driver 35 to operate in a desired manner. Thus by activating the driver circuit at the proper time, the desired voltage output to the load can be achieved.

Emitters 20, 22 emit electromagnetic radiation of one or more desired wavelengths. By way of example only, emitters 20, 22 may comprise LEDs of a known type. The LEDs may be configured to emit electromagnetic radiation in the infrared light region of the electromagnetic spectrum. Without limiting the scope of the present invention, the LEDs may have a modulation, or carrier, frequency of about 40 kHz or greater (e.g., 56 kHz), which matches the modulation, or carrier frequency of detector 21.

Each emitter 20, 22 communicates with and operates under control of processor 33, which causes emitters 20, 22 to emit electromagnetic radiation in a pulsed fashion. Processor 33, which communicates indirectly with an alternating current system through driver 35, may be programmed to cause emitters 20, 22 to emit a predetermined number of groups of pulses of electromagnetic radiation (e.g., four groups from each emitter 20, 22, each group of pulses lasting for about a half of a millisecond when emitters operate at a modulation frequency of 40 kHz) in each half cycle of the AC, each group including the same number of pulses. Processor 33 may be programmed to cause such pulsed emission to begin at or following each detected "zero crossing" of the AC. Emitter 20 emits groups of pulses out-of-phase with the groups of pulses that are emitted by emitter 22. Each group of pulses may include a sufficient number of pulses to facilitate detection thereof by detector 21 (e.g., 12, 16, or more pulses per group are typically adequate).

It is currently preferred that such pulsed electromagnetic radiation emission by emitters 20, 22 be substantially constantly effected, although it is also within the scope of the present invention to shut emitters 20, 22 down periodically or when desired.

The intensity of electromagnetic radiation emitted by emitters 20, 22 may be tailored to set a distance range in which motion across digital switch 10 is detected. By way of example only, emitters 20, 22 may be configured to emit electromagnetic radiation at an intensity which is suitable for detecting a substantially linear (e.g., upward or downward) sweeping, or switching, motion that occurs on faceplate 12 (FIGS. 1 and 2) of digital switch 10, about a half an inch from faceplate 12, up to about six inches from faceplate 12, or a greater distance from intorface cover 11 faceplate 12.

Detector 21 detects at least one wavelength of electromagnetic radiation emitted by one or both emitters 20, 22. Thus, the carrier frequency of detector 21 substantially matches the carrier frequency of a corresponding emitter or emitters 20, 22 (e.g., about 56 kHz or greater). By way of nonlimiting example, detector 21 may comprise an infrared receiver module, such as that manufactured by Vishay Intertechnology, Inc., of Malvern, Pa., as a TSOP48 series miniaturized receiver (e.g.,the TSOP4840 miniaturized receiver operates at a modulation, or carrier, frequency of 40 kHz; the TSOP4856 miniaturized receiver operates at a modulation, or carrier, frequency of 56 kHz).

Visual indicators 24, 26, which communicate with processor 33 and operate under control of programming thereof, may comprise LEDs that emit visible light of a desired color.

As another option, an audio element 48 of a type known in the art (e.g., a driver associated with processor 33 or a separate audio chip, as well as a sounder (e.g., speaker)) may be associated with processor 33 such that an audio signal (e.g., the sound of a conventional light switch clicking) occurs each time the "position" of digital switch 10 is changed.

Each of the electronic elements of digital switch 10 may be powered directly or indirectly with a regulator (not shown in FIG. 3) of desired voltage, such as a 5 V regulator of a known type, so as to prevent each such element from being damaged by voltage spikes.

Of course, a hands-free electrical switch (e.g., digital switch 10) that incorporates teachings of the present invention may also include other features, such as communication ports, that communicate with a processor of the switch (e.g., processor 33) and facilitate remote and/or programmed operation of the switch by use of an appropriately configured remote control unit, a computer or computer network, a security system, another hands-free electrical switch, or the like. The processor of a hands-free electrical switch of the present invention (e.g., processor 33 of digital switch 10) may also be programmed to operate digital switch 10 at certain times of the day, in certain lighting conditions, or otherwise, as known in the art.

Figure 4:
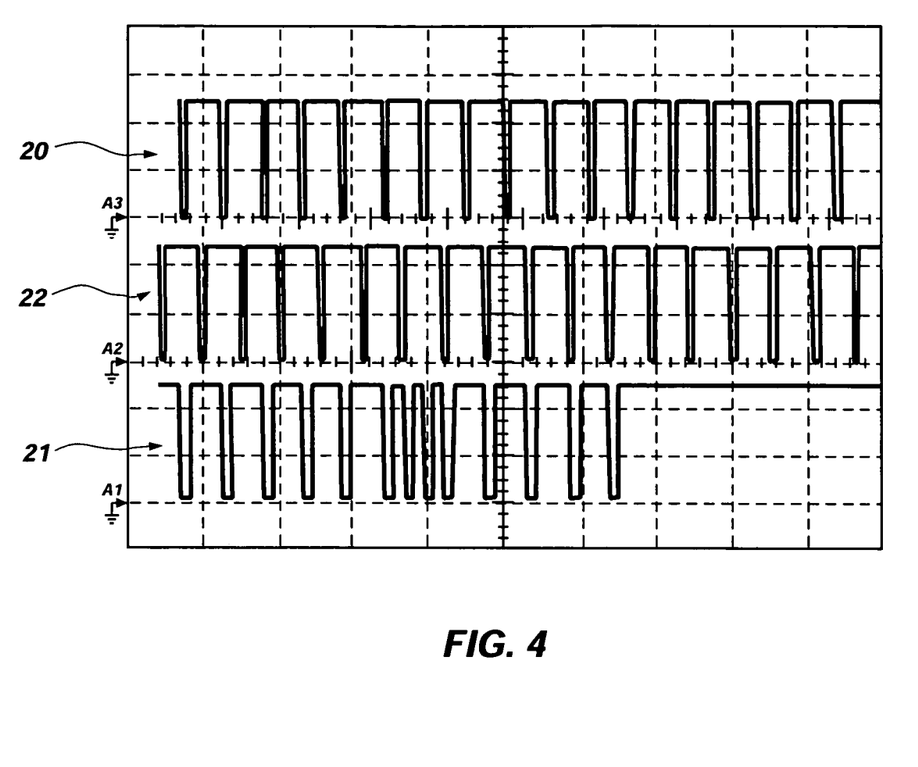
FIG. 4 is a graph depicting emission and detection of electromagnetic radiation in the digital switch of FIGS. 1 through 3.

With returned reference to FIG. 1, an example of use of digital switch 10 is described. Again, the pulsed emission of electromagnetic radiation by emitters 20, 22, is controlled, in an out-of-phase fashion, by processor 33, which operates under control of one or more programs. In addition, detector 21 communicates with processor 33, which operates under control of one or more programs that are configured to determine whether or not detector 21 has sensed an acceptable, intentional switching motion. FIG. 4 is a graph which illustrates the out-of-phase pulsing of electromagnetic radiation from emitters 20 and 22, shown as the uppermost and middle traces, as well as the detection of electromagnetic radiation, which is reflected from a hand, finger, or other object, by detector 21, shown as the lowermost trace. In the lowermost trace, the valleys represent points in time at which electromagnetic radiation is detected by detector 21. Thus, the valleys of the lowermost trace align with corresponding pulses of the uppermost and middle traces. The left side of the lowermost trace indicates that only radiation from the emitter 20, represented by the uppermost trace, is detected. Moving toward the right of the lowermost trace, detector 21, in the pulse sequence, detects a pulse from emitter 20, then a pulse from emitter 22, then another pulse from emitter 20, then another pulse from emitter 22, with a total of four sensed pulses being shown. Finally, the right side of the lowermost trace shows that only electromagnetic radiation emitted by emitter 22 is reflected and, thus, detected by detector 21.

The programming under which processor 33 operates may be configured to cause the switch to change "position" only after a specified number or range of pulses of electromagnetic radiation from one emitter 20, 22 (e.g., two or more pulses), then the other emitter 22, 20 (e.g., two or more pulses), is sensed by detector 21. Processor 33 may be programmed to sense an intentional switching motion even if one or more pulses are not reflected toward or sensed by detector 21. Fewer pulses at each phase than a predetermined minimum, which might be caused by too quick of a sweeping, or switching, motion, or more pulses at each phase than a predetermined maximum, which might be caused by too slow of a sweeping, or switching, motion, would not be considered by processor 33 to be an intentional switching motion. When processor 33 determines that the number of pulses within acceptable ranges and an acceptable sequence of pulses have been sensed, processor 33 determines whether or not the direction of motion over digital switch 10 indicates that the switch "position" should be changed. If so, processor 33 initiates the desired operation of driver 35 (e.g., open (turn "off") or close (turn "on") an electrical circuit in communication therewith by way of terminals 52, 54). If the direction of sensed motion over digital switch 10 indicates that the switch should remain in the same position, processor 33 maintains the status quo by not sending signals to driver 35. Thus, the state (i.e., open or closed) of the electrical circuit is not changed.

As another example of the use of digital switch 10, dimming may be effected by holding a finger, hand, or an object over or in front of only one emitter 20, 22 for a prolonged period of time (e.g., greater than one second, two seconds or more, etc.). For example, if a finger is placed over an upper emitter 20, an intensity of power conveyed through the circuit along which digital switch 10 is positioned may be increased (e.g., ramp-up dimming, or increasing the intensity, of a light). Conversely, if a finger is placed in proximity to a lower emitter 22, an intensity of power conveyed through the circuit may be decreased. Such an increase or decrease in intensity may be effected in a substantially continuous fashion, or incrementally, until the desired intensity of power is being conducted through the circuit, at which point the finger, hand, or other object is removed from proximity to the emitter 20, 22.

When processor 33 determines that the "position" of driver 35 is to be changed, processor 33 may also cause visual indicators 24, 26 to show the new "position" of digital switch 10. For example, if digital switch 10 is in an "on" position, the upper visual indicator 24 may be illuminated. If, in the alternative, the electronic switch is in an "off" position, the lower visual indicator 26 may be illuminated.

When a hands-free electrical switch (e.g., digital switch 10 in FIGS. 1 through 3) according to the present invention is part of a so-called "three-way switch" or other circuit including multiple switches, a processor of each switch (e.g., processor 33 of digital switch 10) may communicate the switch "position" to the processor of each other switch in the circuit. Each processor 33 may then cause its corresponding visual indicators 24, 26, to properly represent the current state of the multi-switch circuit.

Figure 5:
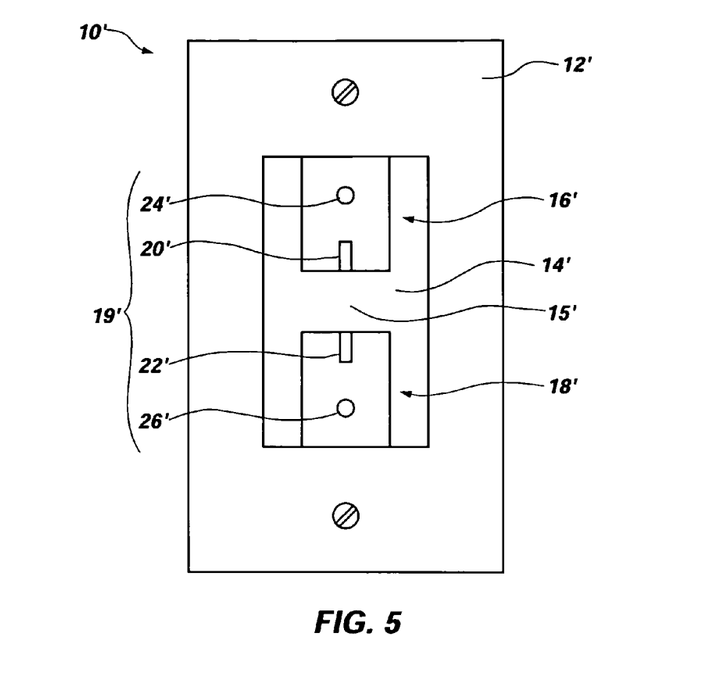
FIG. 5 is a frontal plan view of a digital switch incorporating teachings of the present invention.
Figure 6:
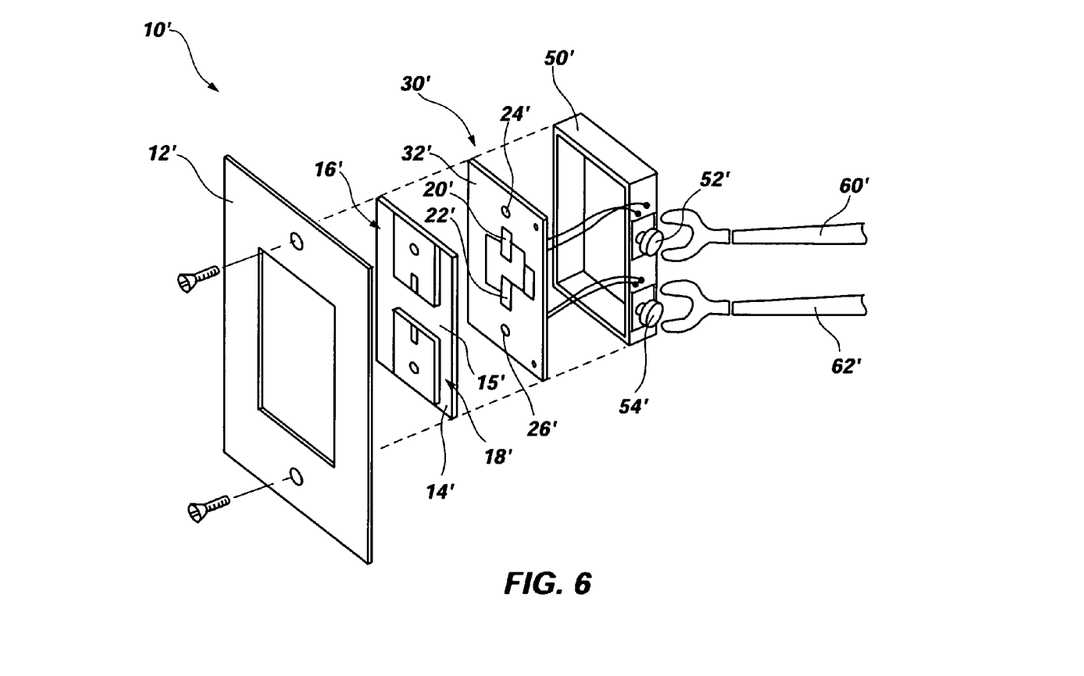
FIG. 6 is perspective schematic exploded representation of the digital switch of FIG. 1.
Figure 7:
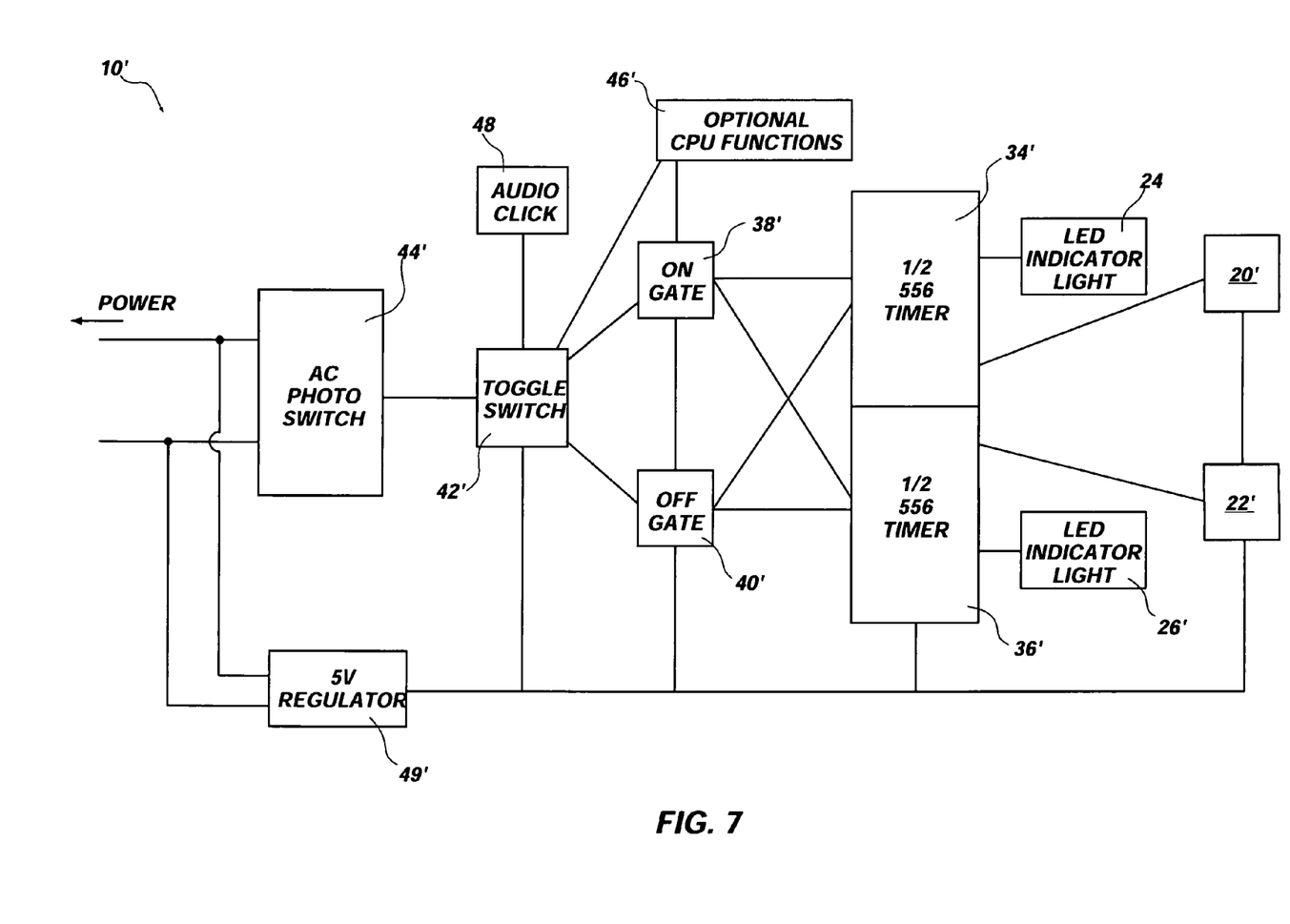
FIG. 7 is a schematic block diagram of the digital switch of FIGS. 5 and 6.

Another embodiment of digital switch 10' according to the present invention is illustrated in FIGS. 5 through 7.

The exterior features of digital switch 10' are illustrated in FIG. 5. Digital switch 10' includes a faceplate 12' which laterally surrounds an interface cover 14'. Interface cover 14' is configured to be coupled with an interior 30' (FIG. 6) and housing 50' (FIG. 6) of digital switch 10', which are at least partially received within a wall (not shown) and to be electrically connected to wires 60, 62 (FIG. 6) within the wall and an electrical circuit of which the wiring is a part. Faceplate 12' is configured to be secured to the wall in such a way as to cover a receptacle, such as a hole, in the wall within which interface cover 14' is received.

As shown in FIG. 5, interface cover 14' includes an upper region 16' and a lower region 18', which roughly correspond to the upper and lower regions of a conventional, manually operated wall-mountable electrical switch. Optical sensors 20', 22' and visual indicators 24', 26' are exposed through an outer surface 15' of both upper region 16' and lower region 18' of exterior housing 14'.

Additional elements of digital switch 10' are shown in FIG. 6. As shown, an interior 30' of digital switch 10' includes a circuit board or other substrate 32' which carries various internal elements of digital switch 10', including, without limitation, optical sensors 20', 22', which make up a motion detection element 19' (FIG. 5), and visual indicators 24', 26'. As will be described in further detail hereinafter, substrate 32' also includes circuitry which may communicate electrically with a housing 50' of digital switch 10' which, in turn, may include terminals 52', 54' that are configured to have wires 60', 62' electrically connected thereto.

Turning now to FIG. 7, the illustrated block diagram schematically depicts the various features of digital switch 10' that may be carried upon substrate 32' (FIG. 6). Optical sensors 20', 22' comprise the input elements of interior 30' of digital switch 10'. By way of example only, optical sensors 20' and 22' may comprise reflective object sensors of a known type, such as the infrared (IR) photodarlington emitter/detector combination, 0 to 0.5 inch distance range optical sensors available from OPTEK Technologies as part no. OPB712. Optical sensors 20', 22' may communicate directly with timers 34', 36', respectively, which also communicate with visual indicators 24', 26', respectively. Each timer 34', 36', in turn, electrically communicates with a pair of switch gates 38', 40', which, in the illustrated example, are respectively labeled as an "on gate" and an "off gate". Both switch gates 38', 40' communicate electrically with an electronic toggle switch 42' of a known type. Electronic toggle switch 42' effects the switching operation provided by digital switch 10'.

Electronic toggle switch 42', in turn, is in electrical communication with an AC (alternating current) photo switch 44', which provides an interface between the DC (direct current) electronic elements of digital switch 10' and wires 60', 62' (FIG. 6), which are a part of an alternating current network. By way of example and not limitation, AC photo switch 44' may comprise an IGBT photovoltaic relay, single pole, normally open 0–280 VAC or 0–400 VDC 1.0 A AC/DC switch, such as that available from International Rectifier as part no. PVX6012.

Optionally, switch gates 38', 40' or electronic toggle switch 42' may communicate and/or be under control of a processor or other, less complex group of logic circuits, both of which are referred to herein as a control element 46'. Control element 46' may, for example, impart digital switch 10' with one or more optional functions, such as dimming functions, timing functions, remote controllability, and other programmable features.

As another option, an audio element 48 of a type known in the art (e.g., a digital audio chip) may be associated with electronic toggle switch 42' such that an audio signal (e.g., the sound of a conventional light switch clicking) occurs each time electronic toggle switch 42' operates.

Each of the electronic elements of digital switch 10 may be powered directly or indirectly with a regulator 49 of desired voltage, such as a 5 V regulator of a known type, so as to prevent each such element from being damaged by voltage spikes.

Referring now to both FIG. 5 and FIG. 7, digital switch 10' may be operated by way of an intended switching motion across interface cover 14'. More specifically, the intended switching motion is effected across optical sensors 20' and 22'. When the intended switching motion is detected by a first sensor, for example, optical sensor 20', that sensor is "tripped" and sends an electrical signal to the corresponding timer 34', which begins operation upon receipt of the electrical signal. If motion is also sensed by a second sensor, for example optical sensor 22', within a predetermined period of time, an electrical signal will be sent to its corresponding timer 34', which enables a corresponding switch gate 40'. Electronic toggle switch 42' maintains the "position" of switch gate 40' until an opposite intended switching motion is detected by optical sensors 20', 22'. Such switching motion may be accompanied by activation of a corresponding visual indicator 24', 26'.

By requiring movement similar to that of conventional, wall-mounted electrical switches, a hands-free electrical switch that incorporates teachings of the present invention may provide a user with a physiological experience similar to that provided by use of a conventional, wall-mounted electrical switch. The visual indication of the position of the switch may enhance the physiological experience for the user. The user's physiological experience may be further enhanced by including one or more components that mimic a switching sound or provide another audible indicator that a switch has been effected may further enhance the user's physiological experience.

Although the present invention has been shown and described with respect to various illustrated embodiments, various additions, deletions and modifications that are obvious to a person of ordinary skill in the art to which the invention pertains, even if not shown or specifically described herein, are deemed to lie within the scope of the invention as encompassed by the following claims.

What is claimed is:

1. A non-contact electrical toggle switch, comprising:
   an electronic switching element;

a motion detection element configured to detect two independent movements which mimic the movements required to physically switch a conventional toggle switch, wherein the mimicking includes the movement characteristics of duration, direction, and distance; and if the motion detection element detects one of the two movements, causing the electronic switching element to switch between a first and second electrical state in a manner which corresponds to only how a conventional toggle switch would operate in response to the detected movement, wherein the first electrical state corresponds to an electrical on state and the second electrical state corresponds to an electrical off state.

2. A non-contact electrical toggle switch of claim 1, wherein the motion detection element includes:
at least two emitters; and
at least one detector.

3. The non-contact electrical toggle switch of claim 2, wherein the at least two emitters are in substantial vertical alignment with one another.

4. The non-contact electrical toggle switch of claim 3, wherein the at least one detector is positioned between the at least two emitters.

5. The non-contact electrical toggle switch of claim 1, wherein the motion detection element is configured to only sense the two movements within about one-half inch to about six inches of the motion detection element.

6. The non-contact electrical toggle switch of claim 1, further comprising:
at least one visible switch state indicator which is configured to change state in manner to provide visual feedback to an operator.

7. The non-contact electrical toggle switch of claim 6, wherein the at least one visible switch state indicator comprises a pair of visible switch state indicators.

8. The non-contact electrical toggle switch of claim 7, wherein each switch state indicator of the pair of switch state indicators comprises a light-emitting diode.

9. The non-contact electrical toggle switch of claim 1, further comprising:
an audio element configured to output an audible signal when one of the two movements are detected by the motion detection element.

10. The non-contact electrical toggle switch of claim 9, wherein the audible signal includes at least two independent audible signals which correspond to the two movements.

11. The non-contact electrical toggle switch of claim 1, wherein the motion detection element is configured to sense a substantially linear movement that substantially emulates movement for changing a state of a conventional toggle light switch.

12. The non-contact electrical toggle switch of claim 1, wherein the two movements include an upward "on" movement and a downward "off" movement.

13. The non-contact electrical toggle switch of claim 1, wherein the detection element is further configured to detect a brightening and a darkening dimming movements which cause the electronic switching element to decrease resistance and increase resistance in response to the respective brightening and darkening dimming movements.

14. The non-contact electrical toggle switch of claim 13, wherein the brightening dimming movement causes the electrical switching element to reduce resistance and the darkening dimming movement dimming movement causes the electrical switching element to increase resistance.

15. A non-contact electrical toggle switch, comprising:
at least one processor;
an electronic switching element in communication with the at least one processor;
a pair of substantially aligned emitters configured to emit electromagnetic radiation, each emitter of the pair in communication with and under control of the at least one processor;
at least one detector positioned between the emitters of the pair and in substantial alignment therewith, the at least one detector configured to detect electromagnetic radiation of at least one wavelength emitted by the emitters, the at least one detector in communication with the at least one processor so as to change between a first and second electrical state of the electronic switching element upon detection of a movement which mimics a movement required to physically switch a conventional toggle switch, wherein the mimicking includes the movement characteristics of duration, direction, and distance, by the at least one detector, wherein the state of the electronic switching element is changed in a manner which corresponds to only how a conventional toggle switch would respond to the detected movement, and wherein the first electrical state corresponds to an electrical on state and the second electrical state corresponds to an electrical off state.

16. The non-contact electrical toggle switch of claim 15, wherein the electronic switching element comprises an optically coupled triac.

17. The non-contact electrical toggle switch of claim 15, wherein the pair of substantially aligned emitters or the at least one detector is configured such that that at least one detector will sense the movement when effected within about six inches thereof.

18. The non-contact electrical toggle switch of claim 15, further comprising:
at least one visible switch state indicator.

19. The non-contact electrical toggle switch of claim 15, further comprising:
an audio element configured to output an audible signal when the movement is detected by the at least one detector.

20. A method for switching a state of an electrical circuit, comprising:
effecting a movement which mimics a movement required to physically switch a conventional toggle switch, wherein the mimicking includes the movement characteristics of duration, direction, and distance, in front of a non-contact electrical switch;
detecting the movement;
timing the movement;
determining whether the timing of the movement occurs within a predetermined time range;
determining whether the movement is effected in a direction which corresponds to a change in the state of the electrical circuit; and
switching between a first and second electrical state of the electrical circuit when the movement occurs within the predetermined time range and is effected in a direction that corresponds to a change in the state of the electrical circuit, wherein the state of the electronic switching element is changed in a manner which corresponds to only how a conventional toggle switch would respond to the detected movement, and wherein the first electrical state corresponds to an electrical on state and the second electrical state corresponds to an electrical off state.

21. The method of claim 20, wherein switching the state of the electrical circuit comprises opening or closing the electrical circuit.

22. The method of claim 20, wherein the movement is only detected if performed within a predetermined distance from the non-contact electrical switch.

23. The method of claim 20, further comprising:
visibly indicating a switch state of the non-contact electrical switch.

24. The method of claim 23, further comprising:
altering a visible indication of the switch state of the non-contact electrical switch when the state of the electrical circuit is changed.

25. The method of claim 20, further comprising:
generating an audible signal when the state of the electrical circuit is changed.

* * * * *